(12) United States Patent
Di Giacomo et al.

(10) Patent No.: US 8,661,373 B2
(45) Date of Patent: Feb. 25, 2014

(54) METHOD FOR THE REAL-TIME MONITORING OF INTEGRATED CIRCUIT MANUFACTURE THROUGH LOCALIZED MONITORING STRUCTURES IN OPC MODEL SPACE

(75) Inventors: Antonio Di Giacomo, Rousset (FR); Romuald Sabatier, Gardanne (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 403 days.

(21) Appl. No.: 12/946,766

(22) Filed: Nov. 15, 2010

(65) Prior Publication Data

US 2011/0057333 A1    Mar. 10, 2011

Related U.S. Application Data

(63) Continuation-in-part of application No. PCT/IB2009/005487, filed on May 1, 2009.

(30) Foreign Application Priority Data

May 15, 2008 (FR) ..................... 08/02627

(51) Int. Cl.
G06F 17/50 (2006.01)
(52) U.S. Cl.
USPC .......................................................... 716/54
(58) Field of Classification Search
USPC .......................................................... 716/54
See application file for complete search history.

(56) References Cited

U.S. PATENT DOCUMENTS

| | | | |
|---|---|---|---|
| 6,363,294 B1 * | 3/2002 | Coronel et al. | 700/121 |
| 2004/0147121 A1 | 7/2004 | Nakagaki et al. | |

FOREIGN PATENT DOCUMENTS

| | | |
|---|---|---|
| EP | 1 329 771 A2 | 7/2003 |
| WO | 2006/012388 A2 | 2/2006 |

OTHER PUBLICATIONS

Hopkins, H. H., "The Concept of Partial Coherence in Optics," Proc. R. Soc. Lond. A 208:263-277, 1951.
Hopkins, H. H "On the Diffraction Theory of Optical Images," Proc. R. Soc. Lond. A 217(1130):408-432, May 7, 1953.
Lu, M. et al., "Improving Model-based Optical Proximity Correction Accuracy Using Improved Process Data Generation," Proceedings of SPIE vol. 6149, 2nd International Symposium on Advanced Optical Manufacturing and Testing Technologies: Advanced Optical Manufacturing Technologies, 2006.

* cited by examiner

*Primary Examiner* — Vuthe Siek
(74) *Attorney, Agent, or Firm* — Seed IP Law Group PLLC

(57) ABSTRACT

The present disclosure relates to a method of controlling the manufacturing of integrated circuits, comprising steps of determining parameters that are characteristic of a curve of radiation intensity applied to a semiconductor wafer through a mask, in critical zones of structures to be formed on the wafer, for each of the critical zones, placing a measuring point in a multidimensional space each dimension of which corresponds to one of the characteristic parameters, placing control points in the multidimensional space that are spread around an area delimited by the measuring points, so as to delimit an envelope surrounding the area, for each control point, defining control structures each corresponding to a control point, generating a mask containing the control structures, applying a process involving the generated mask to a semiconductor wafer, and analyzing the control structures transferred to the wafer to detect any defects therein.

23 Claims, 8 Drawing Sheets

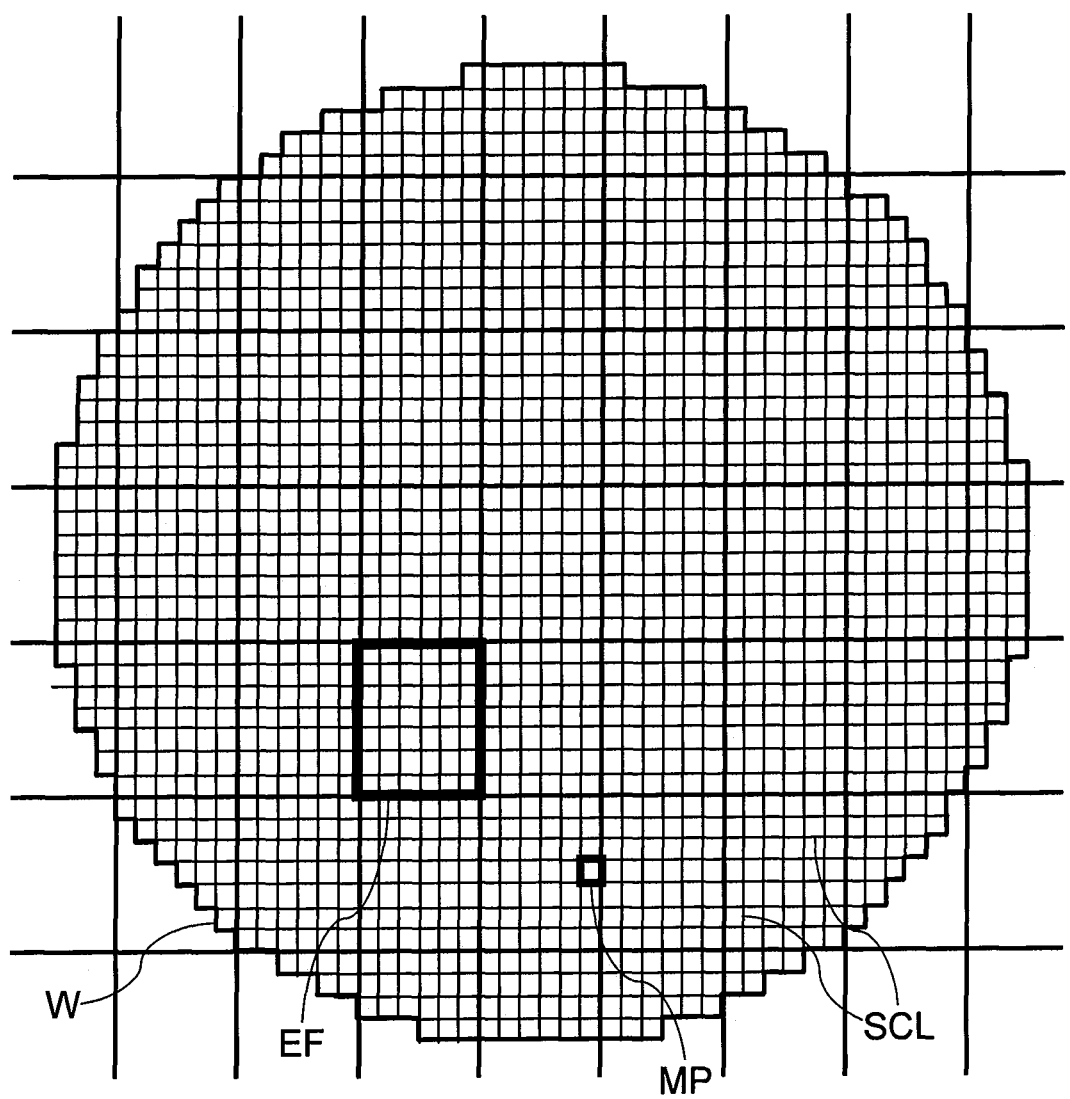
Fig. 13
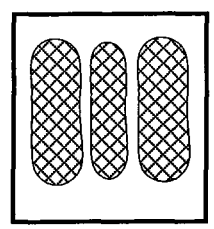 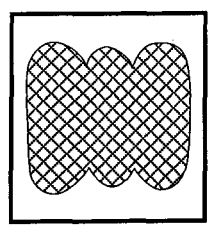
Fig. 14A    Fig. 14B

METHOD FOR THE REAL-TIME MONITORING OF INTEGRATED CIRCUIT MANUFACTURE THROUGH LOCALIZED MONITORING STRUCTURES IN OPC MODEL SPACE

BACKGROUND

1. Technical Field

The present disclosure relates to the manufacturing of integrated circuits. The present disclosure relates more particularly to controlling the different processes which are applied to the semiconductor wafers during the manufacturing of integrated circuits, and particularly the lithography, etching, polishing and planarization processes. The present disclosure also relates to the validation of the masks used during the lithography processing.

2. Description of the Related Art

A lithography process classically comprises steps of depositing a resist layer made of light-sensitive resin onto a wafer made of a semi-conductive material, and of exposing the resist layer through a mask, to radiation (visible light, ultraviolet light, X rays, beam of electrons, etc.). The resist layer exposed to the radiation is then developed so as to form a mask on the wafer. The wafer and the mask formed in the resist layer may then be subjected to an etching process. The mask formed by the resist layer on the wafer may also be used particularly for wet stripping or implants to be performed.

However, these different processes, and in particular the lithography, have limits in terms of miniaturization of integrated circuits. Indeed, the smaller the shapes to be produced on a wafer are, the greater the differences between the shapes desired and the shapes produced are, particularly due to the diffraction effects produced by the mask on the exposure radiation of the mask.

To reduce these differences and in particular the effects of the diffraction during the exposure of a semiconductor wafer through a mask, a technique referred to as Optical Proximity Correction (OPC) has been developed. This technique includes modifying the mask by taking into account the effects of optical proximity so as obtain patterns having a shape as similar as possible to the desired shape. FIG. 1 schematically represents steps of a method PRS1 for generating corrected masks. The method comprises a step TPG of extracting test structures to form a test pattern TP from data defining a mask layout LO. The test structures are basic shapes corresponding to shapes of the layout LO which are critical, i.e. sensitive to the diffraction phenomenon. A test pattern commonly comprises hundreds, or even thousands of basic structures to be representative of the critical shapes to be produced. During a next step MW, the layout LO and test pattern TP data are used to produce a lithography mask MSK. A lithography process LITP through the mask MSK is then applied to a semiconductor wafer W previously covered with a resist layer. During a next step MSD, critical dimensions are measured on the test pattern TP transferred to the wafer W, and possibly on shapes of the layout LO. These measurements are compared with the dimensions of the corresponding shapes on the mask MSK or specified by the layout data LO to obtain Edge Placement Error (EPE) measurements of the critical shapes. The EPE measurements obtained in step MSD are used to determine corrections to be applied to the structures of the layout LO and generate in step OPC a corrected layout CLO, including possibly a corrected test pattern. The layout CLO is then used to generate a new mask (step MW). The new mask is then used to process a new wafer W (step LITP). Measurements are taken on the new wafer to determine the EPE errors (step MSD). If the errors measured are below a certain threshold, the last mask MSK generated is considered valid, otherwise the steps OPC, MW, LITP and MSD are performed again until the EPE errors are below the threshold.

In certain cases, it may be desired to change the layout LO. The method steps described previously must then be executed again.

A Model-Based Optical Proximity Correction (MBOPC) technique has also been developed to determine the aperture threshold of the resist layer according to the shape of a curve of radiation intensity on the resist layer through the mask, it being possible to calculate the curve of radiation intensity on the resist layer for any pattern structure printed on the mask. Thus, the MBOPC technique enables an aperture threshold for the resist layer to be predicted according to variations in the intensity of the radiation applied to the resist layer through a mask. The variations in radiation intensity applied to the resist layer through the mask can be calculated for any pattern configuration. The MBOPC technique also enables the modifications to be made to the geometric features of the patterns to be deduced to obtain structures on a semiconductor wafer which have shapes as similar as possible to a desired layout.

A model is generally defined in accordance with the method PRS2 represented in FIG. 2. The method PRS2 differs from the method PRS1 in that it comprises a modeling step MDLG using a modeling software program enabling EPE measurements to be processed to extract therefrom an aperture threshold model for the resist layer MDL. The aperture threshold of the resist layer corresponds to the radiation intensity necessary to entirely pierce the resist layer. The mask MSK is then corrected using the model MDL to form structures on the wafer W that are similar to the desired layout LO. If the EPE measurements obtained with the new mask are satisfactory, the model is used by the mask production software program to generate other masks having the same integration level. If, on the contrary, the error measurements are too significant, the steps MDLG, OPC, MW, LITP and MSD are executed again until a model is obtained enabling a satisfactory corrected mask to be produced.

An OPC-type model generally comprises an optical model and a processing model. The optical theory at the origin of the optical model is perfectly known and the corresponding calculations can be done accurately (H. H. Hopkins, "The Concept of Partial Coherence in Optics", In Proc. Royal Soc. Series A., Vol. 217, p. 408, 1953, and "On the Diffraction Theory of Optical Images", In Proc. Royal Soc. Series A., Vol. 217, No. 1131, p. 408-432, 1953). The settings of the lithography tools are used to create an optical model which can be adapted to correspond to the empirical data. Software available in the market has been designed for performing approximate calculations of radiation intensity using a breakdown into eigenvectors of the function used to calculate a so-called "aerial" image of the radiation intensities applied to the resist layer through a mask. These calculations relate to millions of structures in the form of a polygon on an actual mask, and are not therefore possible in an industrial environment. Therefore, the OPC-type model performs approximations taking into account only the most "energetic" eigenvectors. However, the generation of a mask takes into account the influence of these approximations on the accuracy obtained.

A processing model is primarily empirical. The radiation intensity variations are simulated thanks to the optical model at points located on line segments referred to as "sites" passing through edges of the structures to be produced on a semiconductor wafer. The combination of this simulation with measurements made using a Scanning Electron Microscope (SEM) on the semiconductor wafer on numerous structures enables a polynomial interpolation to be performed which is supposed to predict for each site located on a structure, the position of the aperture threshold of the resist layer, on the basis of an aerial image simulation.

A processing model MDL therefore classically comprises a polynomial enabling an approximate value of the aperture threshold to be calculated according to shape parameters relating to the curve of radiation intensity on the resist layer through the mask, in the vicinity of a structure edge. The intensity curve shape parameters which are determined empirically, may particularly comprise maximum and minimum local intensities, a maximum slope of the intensity curve (derived from the first order of the curve), the intensity at the point at which the slope of the curve is maximum, the curvature (derived from the second order) of the curve at the point at which the slope of the curve is maximum, the empirical and theoretical aperture thresholds of the resist layer, and the theoretical and empirical values of the Edge Placement Error (EPE) of the pattern. The polynomial used to calculate the aperture threshold of the resist layer is for example as follows:

$$thr=-0.74862+3.13872\ SL-1.95222\ SL^2+0.23562\ IX-0.65241\ IX^2+0.40022\ IX^3-0.05458\ CRV+0.00577\ CRV^2 \qquad (1)$$

wherein SL is the maximum slope, IX the maximum value and CRV the curvature of the intensity curve at the point at which the slope is maximum.

A model may generally be validated by a so-called "sparse" simulation. The sparse simulation uses the model MDL to calculate the so-called "aerial" light intensity, i.e. on the resist layer at points located on line segments referred to as "sites" passing through edges of shapes to be produced on a semiconductor wafer.

Thus, in FIG. 2, the method PRS2 comprises a simulation step SIM enabling simulation of edge placement error (SEPE) measurements to be obtained from the model MDL and from the test pattern TP and/or from the layout LO. Therefore, a model MDL particularly enables the effects of displacing segments in terms of edge placement error to be predicted, without having to print a mask and transfer the mask onto a semiconductor wafer.

During first modeling steps, a model is extracted from a mask layout and validated by applying a lithography and etching process to a semiconductor wafer using a mask, and by performing validation measurements on the processed wafer using images of the wafer obtained for example using a Scanning Electron Microscope (SEM). It will be understood that other systems capable of reaching resolutions similar to that of an SEM can be used, such as an Atomic-Force Microscope (AFM), a Scanning-Tunneling Microscope (STM), or a Transmission Electron Microscope (TEM).

FIG. 3 represents an example of structure the contour of which has the shape of a polygon M1. FIG. 3 also shows the sites SS where measurements are taken. The sites SS are positioned on the polygon M1 by the user during the constitution of the model. During the constitution of the model, each polygon M1 is divided using a fragmentation algorithm which cuts the polygon forming the pattern into segments, with one segment per site SS. The segments of the polygon M1 are delimited in FIG. 3 by the points PF. FIG. 3 also shows, superposed on the structure M1, a structure M2 as simulated or formed on a wafer W from the structure M1. It can be seen that all the angles of the structure M1 have disappeared in the structure M2 particularly due to the effects of the diffraction. The model resulting from the EPE measurements depends on the chosen site positions.

FIG. 4 represents a light intensity curve I(x) representative of the light intensity applied to the resist layer, along a site SS, x being the distance in nm between the point considered and the edge of the structure. In FIG. 4, the curve C1 is between maximum IX and minimum IN intensity values and has a maximum slope SL. The point of aperture of the resist layer (x=0) is within a zone in which the curve C1 reaches the maximum slope SL.

FIG. 5 represents a structure M1' derived from the structure M1, after correction OPC. The derived structure M1' has been obtained by shifting outwards the segments (for example sg1) corresponding to recessed zones (compared to the structure M1) in the produced corresponding structure M2, and by shifting towards the interior of the structure M1, the segments (for example sg2) corresponding to excess zones (compared to the structure M1) in the structure M2.

So-called "dense" 2D simulation methods have also been developed. Dense simulations are performed directly on images obtained for example using a Scanning Electron Microscope (SEM), by comparing the polygonal contours simulated with those extracted from the images. Dense simulations enable better accuracy and exhaustiveness to be achieved, but need greater computing powers and times. To reduce the extent of the calculations to be done, provision can be made to apply a dense simulation only to the test pattern TP. Generally, the choice between a sparse simulation and a dense simulation depends on the complexity and on the level of accuracy of the layout. Due to its cost, the dense simulation is used only when it is very important, particularly when the accuracy of the structures to be formed on a semiconductor wafer reaches 45 nm or is below this value.

As explained above, the structures corrected using the model are validated by printing them on a mask, then by transferring them onto a semiconductor wafer, and finally by performing measurements on the wafer. This validation which involves hundreds of measuring points is extremely time consuming, particularly in terms of computing time, and a high level of skill is needed to use the data obtained. The result of these disadvantages is that it is impossible to control all the structures of a mask and to control the wafers in a production line in real time. There are indeed very few conventional ways of controlling wafers being processed, after a lithography exposure and/or an etching process. One of these ways includes performing on each critical masking level a few SEM measurements of critical structures on isolated measurement sites, or in broader zones, or by using a scatterometer on zones that are consistent in size. This solution is not totally reliable, insofar as it does not enable all the defects likely to appear on the wafers being produced to be detected. Indeed, it is not possible to perform systematic measurements in zones in which the light intensity has an unfavorable shape.

Furthermore, numerous parameters determine the conditions in which the processes are applied to a semiconductor wafer. These parameters particularly determine the lighting conditions, and in particular the light intensity applied to the mask, the focus of the light on the resist layer, the thickness of the resist layer and the conditions of applying the etching process. It transpires that these parameters may fluctuate particularly according to ambient conditions and even cause manufacturing defects of the integrated circuits on the wafer. In the absence of exhaustive monitoring of the manufacturing of integrated circuits, it is not therefore possible to guarantee accuracy and quality in the manufacturing lines of high quantities.

It is therefore desirable to be able to monitor in real time a production line to detect drifts in the settings of the manufacturing parameters and particularly the lithography and etching phases.

Furthermore, it may be desired to change the manufacturing settings or to slightly alter a mask. Such changes cause hundreds of structures to be measured again using an SEM. Each validation step involves many hours of SEM utilization, even if the measurements are automated. These measurements also cause substantial analysis work to be done by a highly qualified person. Then several steps of processing a wafer are implemented. For this purpose, it is thus common to use large quantities of semiconductor wafers to perform exploration tests. As the rapid inspection of all the tests is not possible, one makes choices before the OPC validation, with the risk of eventually finding out that the model is not compatible with the manufacturing process at the time of the final verification.

BRIEF SUMMARY

One embodiment places each segment of each polygon of an actual mask in a multidimensional space having n dimensions, n being the number of considered eigenvectors as mentioned previously, so as to obtain an area in which all the segments are located. This area with n dimensions then enables control structures to be defined that are located in the multidimensional space slightly outside the area, and in a sufficient quantity to surround this area. These control structures are grouped together in a control pattern which is inserted into the mask and monitored using an SEM image. Due to their position outside the area to which the structures of the mask belong, the control structures will be the first to suffer detectable deformations, if drifts appear in the different settings of the processes to be applied to the wafers.

Thus, it is possible to monitor the changes of the entire model on each semiconductor wafer being processed while ensuring that if the control pattern is correct, the other patterns formed on the wafer are correct. The constitution of a control pattern also enables a model derived from another previously validated model to be validated more rapidly, or conversely, unreliable solutions to be removed more rapidly. The constitution of a control pattern also enables the derived models which are the most likely to successfully undergo the validation test to be selected. The result is a significant gain in the development cycle time.

Thus, according to one embodiment, there is provided a method of controlling the manufacturing of integrated circuits, comprising steps of: determining parameters that are characteristic of a curve of radiation intensity applied to a semiconductor wafer through a mask, in critical zones of structures to be formed on the wafer, and for each of the critical zones, placing a measuring point in a multidimensional space each dimension of which corresponds to one of the characteristic parameters, according to the value of each of the parameters that are characteristic of the intensity curve in the critical zone. According to one embodiment, the method comprises steps of: placing control points in the multidimensional space which are spread around an area delimited by endmost measuring points, so as to delimit an envelope surrounding the area, for each control point, defining a control structure so that a curve of radiation intensity on the control structure has values of characteristic parameters corresponding to the control point, and applying a process to a semiconductor wafer which involves a mask containing the control structures, to transfer the control structures to the wafer.

According to one embodiment, the method comprises a step of analyzing the control structures transferred to the wafer to detect any defects therein.

According to one embodiment, the analysis of the control structures comprises steps of forming an image of the control structures transferred to the wafer, and of analyzing the image to detect defects therein.

According to one embodiment, the image analysis comprises a step of comparing each control structure with an image of the control structure as transferred to a semiconductor wafer.

According to one embodiment, the image comparison step comprises steps of detecting the number of polygons in the image and the number of polygons in the control structure, of comparing the numbers of polygons in the image and in the control structure, and of activating an error signal if the comparison step shows a difference.

According to one embodiment, the control structures are grouped together in a control pattern the size of which is such that it can be entirely viewed in a single image with a sufficient definition to detect defects therein.

According to one embodiment, the control structures are placed in the mask in a zone not used for the manufacturing of integrated circuits.

According to one embodiment, the control structures are placed in the mask in a zone provided for the passing of a scribe line for cutting the wafer.

According to one embodiment, a control structure is derived from a critical zone structure corresponding to a point in the multidimensional space near the control point corresponding to the control structure.

According to one embodiment, the method comprises steps of adjusting the sensitivity of each control structure in relation to a drift of a parameter defining conditions of processing a semiconductor wafer.

According to one embodiment, the parameters characteristic of a curve of radiation intensity in a critical zone of a structure to be formed on the wafer are determined using an aperture threshold model of a resist layer formed on the wafer.

According to one embodiment, the control structures are inserted into several masks involved in manufacturing the integrated circuits on a semiconductor wafer.

According to one embodiment, the control structures transferred to a semiconductor wafer by a mask are analyzed several times at the end of different processes applied to the wafer.

According to one embodiment, the processes applied to a semiconductor wafer after which an analysis of the control structures transferred to the wafer is performed, include at least one of the processes comprising a lithography process, an etching process, a planarization process, and a polishing process.

According to one embodiment, a method is also provided of controlling a lithography mask used in the manufacturing of integrated circuits on a semiconductor wafer. According to one embodiment, the method of controlling a mask comprises steps of executing the manufacturing control method as defined above, the mask being considered non-viable if the analysis of the control structures transferred to a semiconductor wafer shows defects.

BRIEF DESCRIPTION OF THE SEVERAL VIEWS OF THE DRAWINGS

Examples of embodiments of the present disclosure will be described below in relation with, but not limited to, the following Figures:

FIG. 13 represents a semiconductor wafer, FIGS. 14A and 14B represent a structure formed on a semiconductor wafer, respectively with and without any defects.

DETAILED DESCRIPTION

Figure 6:
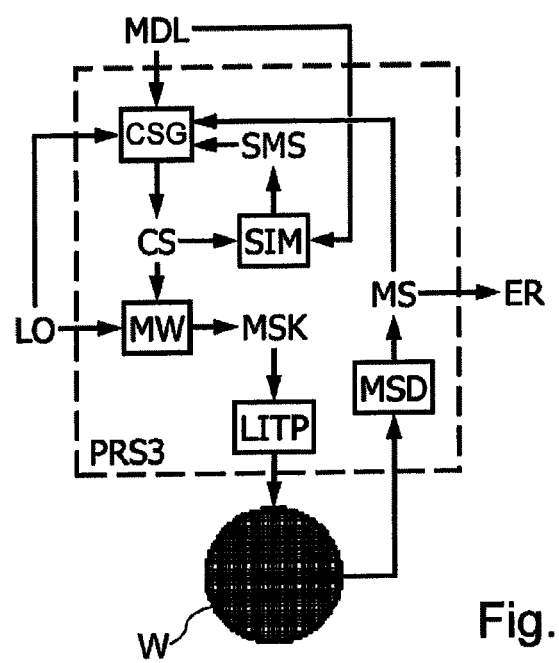
FIG. 6 represents steps of a control method according to one embodiment.

FIG. 6 represents steps of a control method PRS3 according to one embodiment. In FIG. 6, the method comprises a step of generating CSG control structures CS using a mask layout LO and a model MDL. The control structures are generated so as to be more sensitive to drifts of manufacturing parameters than the integrated circuit structures to be formed on a semiconductor wafer W. During a next step MW, a mask MSK is generated from the control structures CS and the layout LO. Then there is a lithography step LITP possibly followed by an etching step to transfer the mask MSK to a resist layer previously deposited on a semiconductor wafer W. During a next step MSD, measurements are taken on the wafer W so as to assess the features MS of the control structures CS transferred to the wafer. If the features obtained are not satisfactory, a new generation and validation cycle is performed to change one or more of the control structures (step CSG), to transfer them to a wafer W (steps MW, LITP), and to measure the features MS of the control structures CS transferred to the wafer.

If the features obtained are satisfactory, the control structures obtained in step CSG are validated and inserted into the masks so as to monitor the lithography and etching processes applied to semiconductor wafers during the manufacturing of integrated circuits. Thus, further to step LITP, measurements are taken on the validated control structures (step MSD), and if errors or drifts are observed in the control structures transferred to the wafer, an error signal ER is activated.

The control structures can also be partly validated by simulation steps SIM using a model MDL and enabling the features SMS of the structures transferred onto a wafer W to be assessed.

Figure 1:
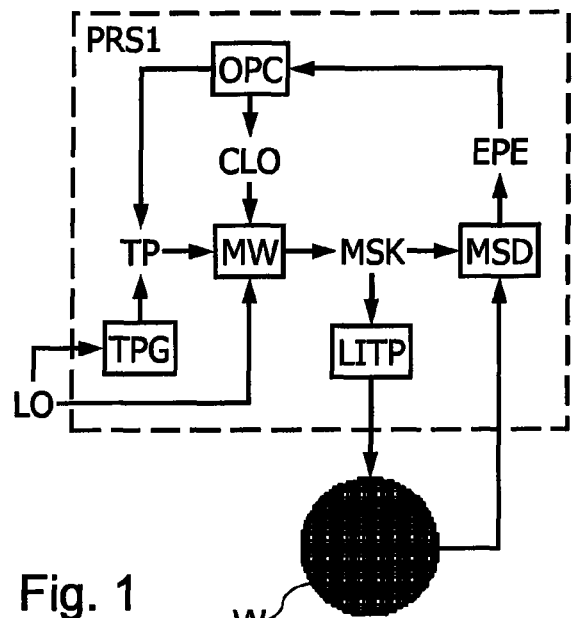
FIGS. 1 and 2 described previously represent steps of adjusting the OPC process associated with the lithography methods, FIG. 3 described previously represents an example of a structure present on a lithography mask, FIG. 4 described previously represents a curve of light intensity along a site on the resist layer formed on a wafer, FIG. 5 described previously represents an example of a corrected structure, present on a lithography mask, derived from the structure represented in FIG. 3.
Figure 2:
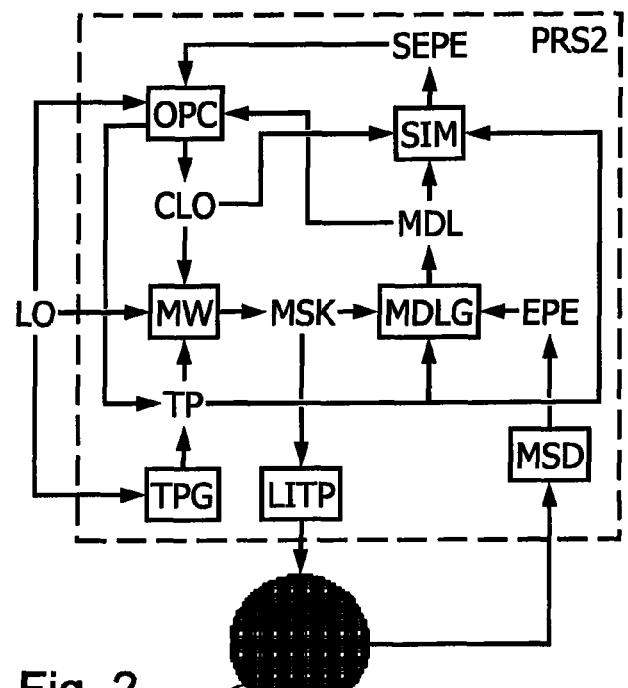
Figure 3:
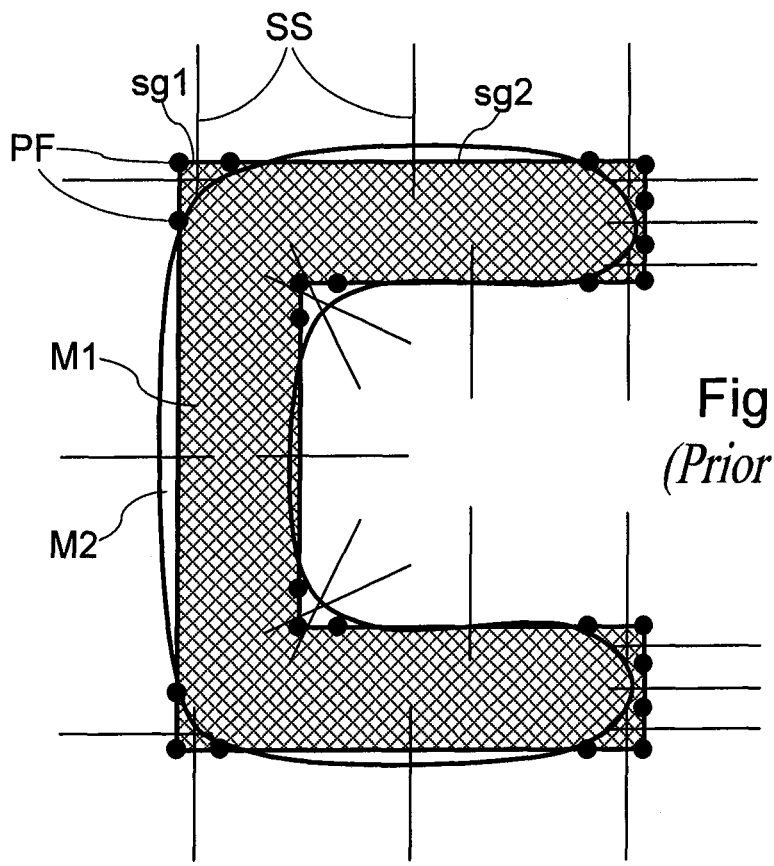
Figure 4:
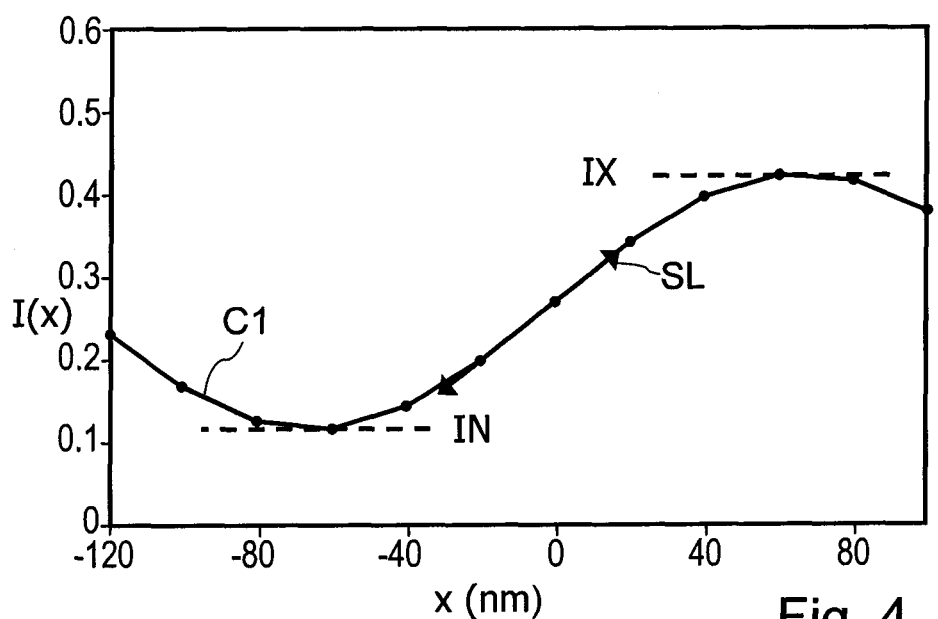
Figure 5:
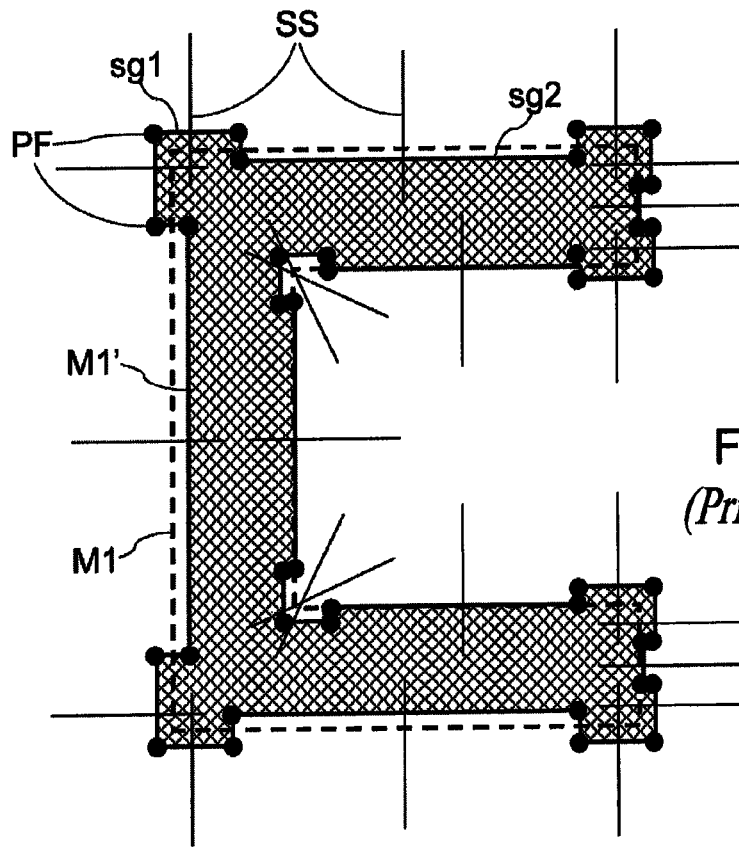

A model can be generated from test structures TP extracted from the structures of the mask, in accordance with the method PRS2 (FIG. 2). The modeling comprises a step of determining, by means of measurements, parameters characterizing the curve of light intensity (such as the one in FIG. 4) on the resist layer along measurement sites SS on the test structures. The parameters characterizing the light intensity curve comprise for example the minimum IN and maximum IX values of the curve, the maximum slope SL of the curve and the curvature CRV either at the point at which the slope of the curve is maximum, or at the point of intersection between the site and the initial polygon, depending on the type of model.

Figure 7:
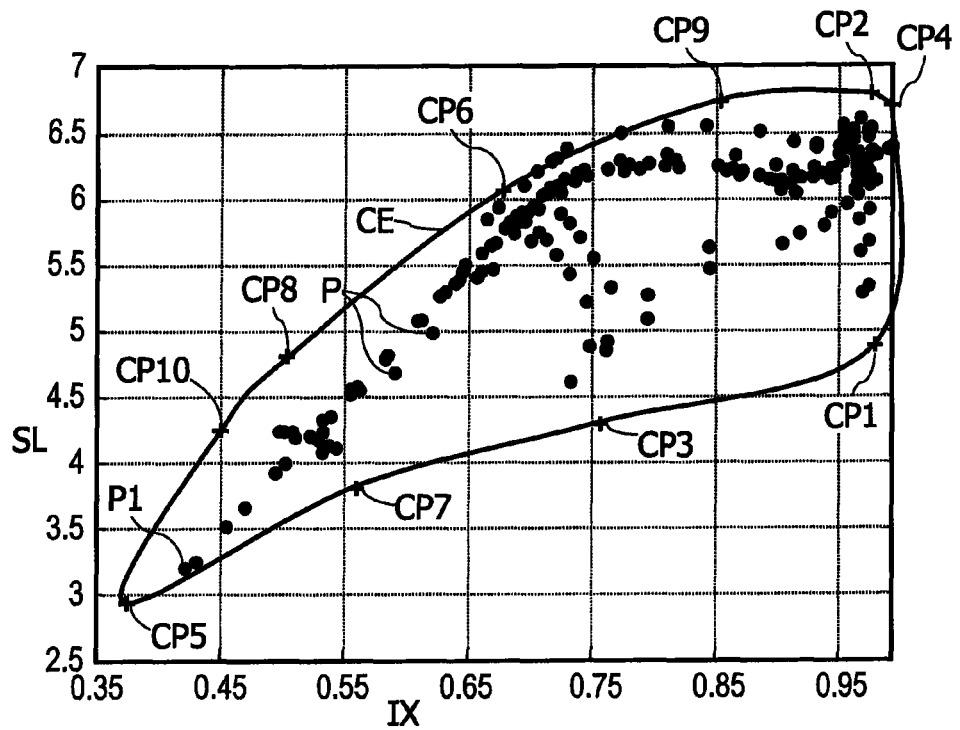
FIGS. 7 and 8 represent projections in two planes of the model space, of points each corresponding to a measurement site on a semiconductor wafer.
Figure 8:
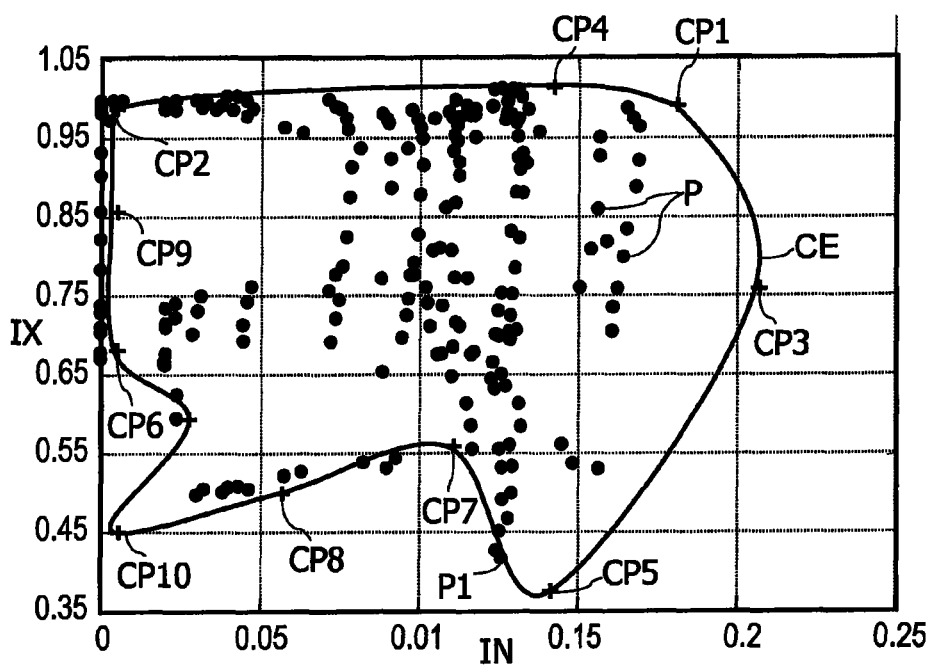

Furthermore, a multidimensional space is defined which is referred to as "model space" each dimension of which corresponds to an eigenvector or a parameter, characterizing the light intensity curve, such as IN, IX, SL, and CRV. Therefore, each measurement site SS corresponds to a point in the model space. FIG. 7 represents a projection of the points P thus obtained in the plane (IX, SL). FIG. 8 represents a projection of the points P in the plane (IN, IX). All the points P obtained are located in a volume V delimited by the endmost points. The volume V can be calculated using the following formula:

$$V = \int_{IX_{min}}^{IX_{max}} \int_{IN_{min}}^{IN_{max}} \int_{SL_{min}}^{SL_{max}} \int_{CRV_{min}}^{CRV_{max}} \ldots vxyz \ldots dvdxdydz \quad (2)$$

in which IXmax, IXmin, INmin, IXmax, SLmax, SLMin, CRVmax, and CRVmin are the maximum and minimum values of the parameters IX, IN, SL and CRV for all the points P.

The control structures are then determined by choosing corresponding control points in the model space, around the volume V and near the latter. The control points are also spread around the volume V in a substantially homogenous or uniform manner so as to delimit an envelope fully surrounding the volume V. The control points can be positioned using a display software program, enabling the volume V to be viewed in different planes. Thus, FIGS. 7 and 8 represent control points CP1 to CP10 which have been spread around the volume V at a short distance from the latter. FIGS. 7 and 8 also show the approximate intersection of the envelope CE delimited by the points CP1-CP10 with the planes (IX, SL) and (IN, IX).

The number of control points CP1-CP10 chosen is for example determined so that all the control structures, each corresponding to a point CP1-CP10, can be viewed in one or two SEM images having a sufficient magnification ratio to detect possible defects therein. For example, with a magnification ratio of 25K, an SEM image corresponds to a zone of 5×5 μm on a semiconductor wafer. The control structures are spread out in a control pattern of rectangular shape so as to be spaced apart by a minimum distance in excess of which the structures do not interact between themselves. This minimum distance is referred to as "optical diameter". If each control structure occupies a slightly greater surface area than 1 μm$^2$, including a guard zone around the control structure to avoid interactions with the other structures, an SEM image with a magnification ratio of 40K may comprise about ten control structures.

It shall be noted that the points P located on or in the vicinity of the axis IN=0 in FIG. 8 correspond to values lower than 1%. Therefore, these values are not significant due to the accuracy of the calculations enabling the points to be positioned in the model space. This is why control points such as CP4, CP6 and CP9 in FIG. 8 may appear surrounded by points P. Certain points P may also appear outside the envelope CE due to the fact that FIGS. 7 and 8 have a projection of the points P in a plane and that the intersection of the envelope CE with the plane represented on the Figures is drawn in a very approximate manner.

Figure 9:
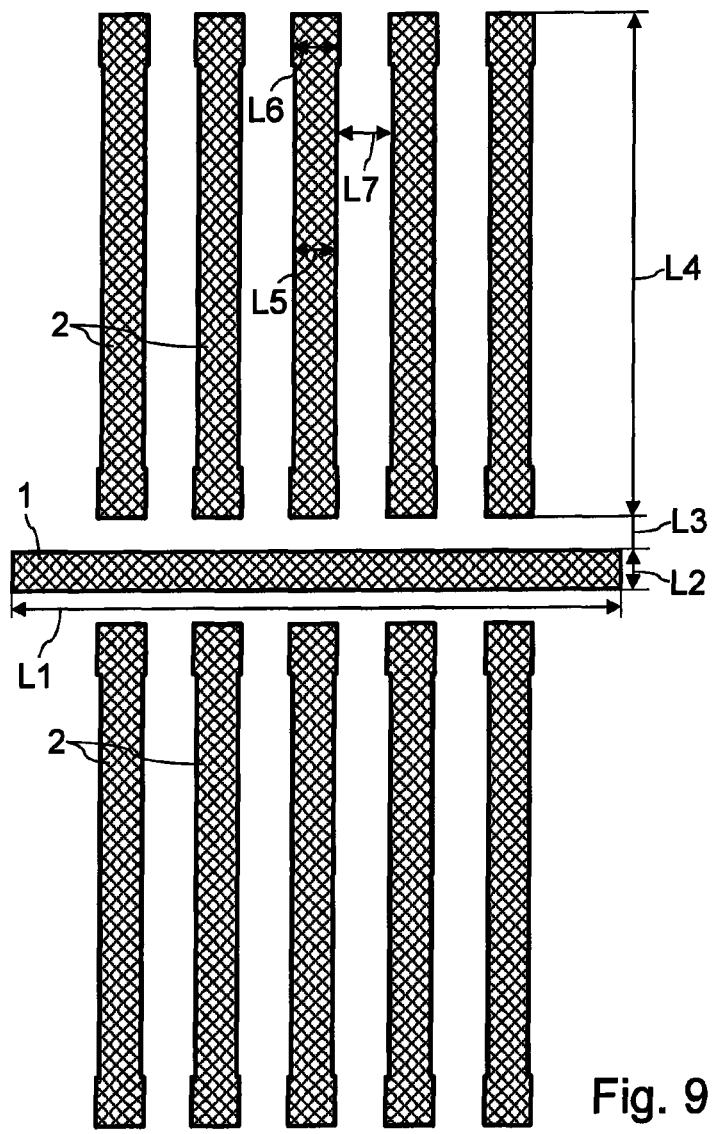
FIG. 9 represents an example of a structure likely to be formed on a semiconductor wafer.

During a next step, a control structure is generated for each control point CP1-CP10 chosen. A control structure corresponding to a control point can be generated using an integrated circuit structure corresponding to a point P near the considered control point. Thus, FIG. 9 represents an integrated circuit structure comprising a central line 1 and ten polygons 2 in the shape of an I aligned perpendicularly to the central line 1, and divided into two rows of five polygons, on either side of the central line 1. The line 1 has a length L1 of 2.010 µm and a width L2 of 0.130 µm. The line 1 is separated from the polygons 2 by a distance L3 of 0.110 µm. Each polygon 2 has a length L4 of 1.650 µm and a central part of width L5 equal to 0.134 µm. The end parts of the polygons 2 have a width L6 of 0.159 µm. The central parts of the polygons 2 are spaced out from one another by a distance L7 of 0.186 µm. This structure corresponds to the point P1 having the lowest maximum intensity value IX and the lowest maximum slope SL in FIGS. 7 and 8.

Figure 10:
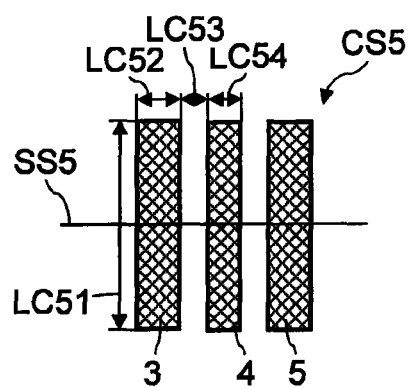
FIG. 10 represents a control structure derived from the structure represented in FIG. 9.

FIG. 10 represents a control structure CS5 derived from the integrated circuit structure in FIG. 9 and corresponding in the model space to the control point CP5. The point CP5 corresponds to maximum intensity IX and slope SL values lower than those of the point P1 corresponding to the structure in FIG. 9. The control structure CS5 comprises three parallel line sections 3, 4, 5 of the same length LC51. The sections 3, 4, 5 are spaced out by a distance LC53. The central section 4 has a width LC54 less than the width LC52 of the lateral sections 3, 5.

To change from the structure in FIG. 9 to the control structure CS5, the central line 1 has been kept, but its length has been reduced to limit the surface area occupied by the control structure. The distance LC53 has been chosen equal to the distance L4 between the central line 1 and the polygons 2. The lateral sections 3, 5 have been chosen so as to obtain similar optical parameters, but with a lower maximum intensity value IX and a lower maximum slope SL. To reduce the value of the maximum slope SL, the width of the central section 4 is decreased compared to that of the line 1. Thus, the width LC54 of the section 4 is chosen lower than the width LC52 of each of the lateral sections 3, 5. In the example in FIG. 10, LC51=0.800 µm, LC52=0.165 µm, LC53=0.110 µm and LC54=0.120 µm.

It shall be noted that these values are chosen according to DRM specifications (Design Rule Manual), with a few slight dispensations being possible. Thus, in the previous example, the width of the central line is lower by 10 nm than the minimum width of a structure indicated in the specifications.

Figure 11:
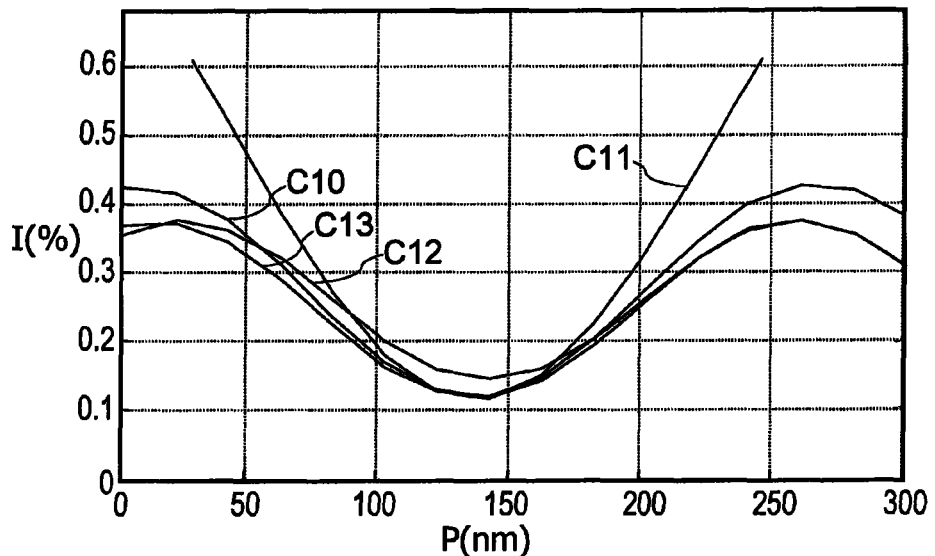
FIG. 11 represents curves of light intensity on the resist layer.

During a next step, a curve of light intensity simulation in the plane of the resist layer along each site (SS5 for the control structure CP5) of each control structure is drawn so as to determine the position of the control structure in the model space. FIG. 11 represents examples of curves C10 to C13 of light intensity percentage according to the position along a site on a control structure.

Each control structure obtained is iteratively changed to reach the point CP1-CP10 desired in the model space. Thus, in FIG. 11, the curve C10 has been obtained along the site SS5 in an original structure derived from the structure in FIG. 9. The curves C11 and C12 have been obtained with intermediate structures, and the curve C13 has been obtained with the final structure as represented in FIG. 10 with the dimensions LC51-LC54 as previously specified.

Figure 12:
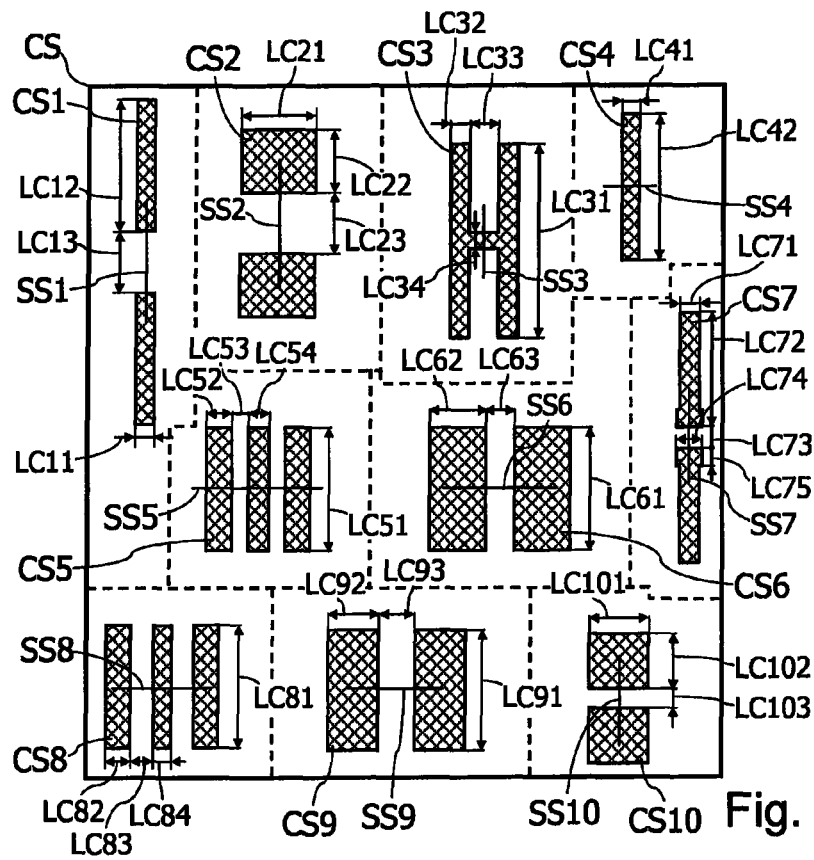
FIG. 12 represents an example of a control pattern comprising the control structure in FIG. 10.

The control structures obtained are spread in a rectangular zone so as to form a control pattern which can be viewed in a single image SEM with a sufficient resolution to enable possible defects to be detected. FIG. 12 represents an example of such a control pattern CS. In FIG. 12, the control pattern CS has a square shape, for example of 5 µm per side, in which ten control structures CS1-CS10 are spread out corresponding to the ten control points CP1-CP10. Each structure CS1-CS10 comprises a measurement site SS1-SS10. The structures CS1-CS10 are sufficiently spaced out from one another in the pattern CS so as not to interfere with each other. For this purpose, the minimum distance between two control structures is chosen greater than or equal to the optical diameter. In the example in FIG. 12, the optical diameter is less than 1.024 µm.

The structure CS1 comprises two identical line sections, aligned and spaced out by a distance LC13. Each line section has a width LC11 and a length LC12. In the example in FIG. 12, LC11=0.120 µm, LC12=0.855 µm and LC13=0.400 µm.

Each of the structures CS2, CS6, CS9 and CS10 comprises two identical rectangles, aligned and spaced out by a distance LC23, LC63, LC93, LC103. The aligned edges of the two rectangles have a length LC22, LC62, LC92, LC102. The other edges of the two rectangles have a length LC21, LC61, LC91, LC101. In the example in FIG. 12, LC21=0.500 µm, LC22=0.415 µm, LC23=0.390 µm, LC61=0.800 µm, LC62=0.375 µm, LC63=0.180 µm, LC91=0.800 µm, LC92=0.335 µm, LC93=0.230 µm, LC101=0.400 µm, LC102=0.360 µm and LC103=0.132 µm.

The structure CS3 has the shape of an H, with two parallel line sections and a perpendicular line section linking the two parallel line sections at their median zone. The parallel line sections have a length LC31 and a width LC32, and are spaced out by a distance LC33. The perpendicular line section has a width LC34. In the example in FIG. 12, LC31=1.270 µm, LC32=0.128 µm, LC33=0.194 µm and LC34=0.110 µm.

The structure CS4 comprises a single line section having a width LC41 and a length LC42. In the example in FIG. 12, LC41=0.120 µm and LC42=0.950 µm.

The structure CS7 comprises two identical line sections, aligned and spaced out by a distance LC73. Each line section has a width LC71 and a length LC72. The zones opposite the two line sections have a greater width LC74 and extend over a length LC75. In the example in FIG. 12, LC71=0.129 µm, LC72=0.750 µm, LC73=0.132 µm, LC74=0.169 µm and LC75=0.104 µm.

The structure CS8 comprises three parallel line sections, of a length LC81 and spaced out by a distance LC83, with a central line section having a width LC84, and two lateral line sections having a width LC82. In the example in FIG. 12, LC81=0.800 µm, LC82=0.165 µm, LC83=0.140 µm and LC84=0.130 µm.

The control pattern CS is then placed in the mask corresponding to the process to be controlled. The control pattern CS can be placed in an unused zone of the mask, for example on a scribe line. FIG. 13 represents a semiconductor wafer W on which the scribe lines SCL appear that are provided for dividing the wafer into chips MP each comprising an integrated circuit. FIG. 13 also shows an exposure field EF which is applied to the wafer upon each lithography process. In the example in FIG. 13, the exposure field EF covers a surface corresponding to 42 chips MP. The scribe lines SCL may indeed have a sufficient width (about 80 to 100 µm in the example of FIGS. 9, 10 and 12) to insert thereinto a pattern of approximately 5×5 µm. If more control structures are desired to guarantee a sufficient probability of detecting a process defect, it is possible to consider arranging the control structures in two control patterns which are placed in an unused zone of the mask, for example on a scribe line. One can then acquire and analyze two SEM images to analyze the control structures.

It will be understood that the control pattern may be placed in zones provided for receiving integrated circuit structures. This measurement can be applied particularly when the scribe lines are very narrow or when the chips are very small.

The mask thus changed is then transferred to a semiconductor wafer. A control pattern can thus be designed and inserted into each mask used to produce an integrated circuit on a semiconductor wafer W, with the possibility of checking each control pattern further to each lithography or etching process applied to the wafer, and more generally upon each process likely to produce or change shapes on the wafer, such as the polishing and mechanical or chemical planarization processes.

To use the control patterns thus produced, it is sufficient to include in the processing line, the acquisition of an image of the control pattern after each process. The image of the control pattern on the semiconductor wafer is then analyzed to determine the reliability of the process that has just been performed. This analysis may comprise an automatic detection of the number of polygons in the control pattern. If the number of polygons detected does not correspond to the number of polygons included in the control pattern, this means that one or more polygons have been divided (case of discontinuities) or on the contrary that one or more polygons have been linked (case of bridging). In this case, the error signal ER is activated.

Figure 15:
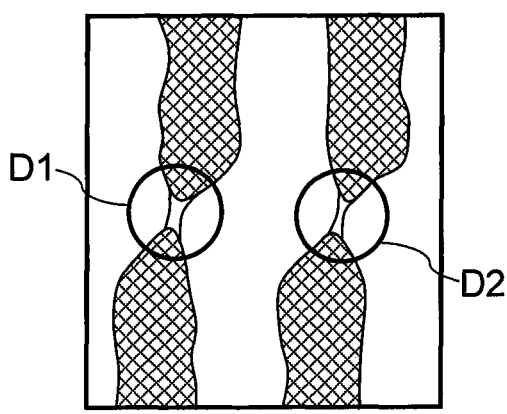
FIGS. 15 and 16 represent other structures formed on a wafer with defects.
Figure 16:
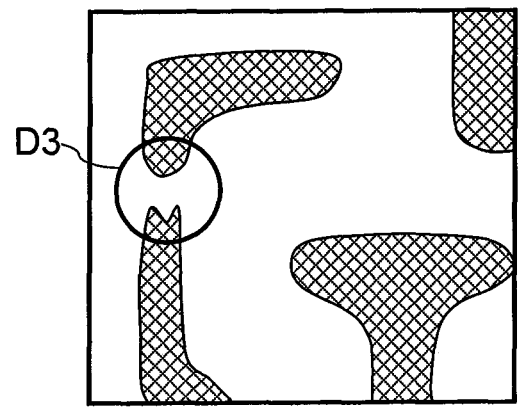

FIGS. 14A, 14B represent a structure transferred onto a semiconductor wafer and comprising three line sections. FIG. 14A shows the case in which the structure has been correctly transferred to the wafer, and FIG. 14B, the case in which a bridging has formed between the three line sections. FIGS. 15 and 16 represent parts of polygons transferred onto a wafer. FIG. 15 represents bridging D1, D2 formed between ends of line sections. FIG. 16 represents an undesired separation D3 of a polygon into two separated polygons.

The image of the control pattern can also be analyzed manually, for example by superimposing the image of the pattern on the control pattern as it was inserted into the mask. A finer analysis can also be done by seeking to detect significant variations in thickness (or in edge positions) of the polygons of the control pattern, without waiting for control polygons to merge or split into two parts.

The method that has just been described may comprise iterative steps of improving the control pattern CS consisting in changing control structures of the pattern until a satisfactory result is obtained, particularly in terms of the positioning of each control point CP1-CP10 corresponding in the model space to the control structures CS1-CS10, compared to the volume V gathering all the points corresponding to the shapes of the mask. Iterative steps can also be provided to adjust the sensitivity of the control structures to variations in conditions of performing lithography and etching processes. Thus, the control pattern can be transferred onto a wafer W, particularly in different conditions of lighting the resist layer, of focusing the light on the resist layer, by varying the thickness of the resist layer or the conditions of the etching process.

The method as previously described can also be applied to the validation of a mask. If the control structures derived from the mask cannot be performed without fault, this means that the mask does not enable integrated circuit structures to be produced with sufficient reliability.

It will be understood by those skilled in the art that various alternative embodiments and applications of the present disclosure may be made. In particular, the present disclosure can be applied to other processes involved in the manufacturing of integrated circuits, and in particular to all the processes likely to change the shapes of structures formed in or on a semiconductor wafer.

Furthermore, errors in the control structures can also be detected on a structure-by-structure basis, using an image of each control structure. Thus, it is not necessary for all the control structures to be grouped together in a pattern of rectangular shape.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   determining characteristic parameters that are characteristic of an intensity curve of radiation to be applied to a semiconductor wafer through a mask, in zones of structures to be formed on the wafer;
   for each of the zones, placing a measuring point in a multidimensional space having dimensions that correspond to the characteristic parameters, respectively, according to values of the characteristic parameters that are characteristic of the intensity curve in the zone;
   placing control points in the multidimensional space which are spread around an area delimited by endmost measuring points, so as to delimit an envelope surrounding the area;
   for each control point, defining a control structure having values of the characteristic parameters corresponding to the control point; and
   transferring the control structures to the semiconductor wafer using a process which involves a mask containing the control structures, the transferring including defining the control structures in or on the semiconductor wafer using the process that involves the mask.

2. A method according to claim 1, comprising analyzing the control structures transferred to the wafer to detect any defects therein.

3. A method according to claim 2, wherein the analyzing comprises forming an image of the control structures transferred to the wafer, and analyzing the image to detect defects therein.

4. A method according to claim 3, further comprising storing each defined control structure, wherein analyzing the image comprises comparing each stored control structure with the image of the control structure transferred to a semiconductor wafer.

5. A method according to claim 4, wherein the control structures include a number of polygons and the comparing comprises detecting the number of polygons in the image and the number of polygons in the stored control structure, comparing the numbers of polygons in the image and in the stored control structure, and activating an error signal if the comparing shows a difference.

6. A method according to claim 1, wherein the control structures are grouped together in a control pattern having a size such that the control pattern can be entirely viewed in a single image with a sufficient definition to detect defects therein.

7. A method according to claim 1, wherein the control structures are placed in the mask in a zone not used for manufacturing integrated circuits.

8. A method according to claim 1, wherein the control structures are placed in the mask in a zone provided for passing a scribe line for cutting the wafer.

9. A method according to claim 1, wherein, for each control point, defining the control structure for the control point includes deriving the control structure for the control point from a zone structure corresponding to a point in the multi-dimensional space near the control point.

10. A method according to claim 1, comprising adjusting a sensitivity of each control structure in relation to a drift of a parameter defining conditions of processing the semiconductor wafer.

11. A method according to claim 1, wherein the characteristic parameters are determined using an aperture threshold model of a resist layer formed on the wafer.

12. A method according to claim 1, wherein the control structures are inserted into several masks involved in manufacturing integrated circuits on the semiconductor wafer.

13. A method according to claim 1, wherein the control structures transferred to the semiconductor wafer using the mask are analyzed several times at ends of different processes applied to the wafer.

14. A method according to claim 13, wherein the different processes applied to the wafer include at least one of a lithography process, an etching process, a planarization process, and a polishing process.

15. A method of claim 1, comprising checking whether the lithography mask is viable, the mask being considered non-viable if the analysis of the control structures transferred to the semiconductor wafer shows defects.

16. A method, comprising:
    determining a characteristic parameter that is characteristic of an intensity curve of radiation to be applied to a semiconductor wafer through a mask, in a zone of a structure to be formed on the wafer;
    placing measuring points in a multidimensional space, having a dimension that corresponds to the characteristic parameter, according to values of the characteristic parameter that are characteristic of the intensity curve in the zone;
    placing control points in the multidimensional space which are spread around an area delimited by endmost measuring points, so as to delimit an envelope surrounding the area;
    defining a plurality of control structures associated with the control points, respectively, each control structure having a value of the characteristic parameter corresponding to the associated control point; and
    transferring the control structures to the semiconductor wafer using a process which involves a mask containing the control structures, the transferring including defining the control structures in or on the semiconductor wafer using the process that involves the mask.

17. A method according to claim 16, comprising analyzing the control structures transferred to the wafer to detect any defects therein, wherein the analyzing comprises forming an image of the control structures transferred to the wafer, and analyzing the image to detect defects therein.

18. A method according to claim 17, further comprising storing each defined control structure, wherein analyzing the image comprises comparing each stored control structure with the image of the control structure transferred to a semiconductor wafer.

19. A method according to claim 18, wherein the control structures include a number of polygons and the comparing comprises detecting the number of polygons in the image and the number of polygons in the stored control structure, comparing the numbers of polygons in the image and in the stored control structure, and activating an error signal if the comparing shows a difference.

20. A method according to claim 16, wherein the control structures are placed in the mask in a zone not used for manufacturing integrated circuits.

21. A method according to claim 16, wherein the control structures transferred to the semiconductor wafer using the mask are analyzed several times at ends of different processes applied to the wafer.

22. A method according to claim 21, wherein the different processes applied to the wafer include at least one of a lithography process, an etching process, a planarization process, and a polishing process.

23. A method of claim 16, comprising checking whether the lithography mask is viable, the mask being considered non-viable if the analysis of the control structures transferred to the semiconductor wafer shows defects.

* * * * *